United States Patent
Orenstein et al.

(10) Patent No.: US 10,171,054 B1
(45) Date of Patent: Jan. 1, 2019

(54) AUDIO ADJUSTMENT BASED ON DYNAMIC AND STATIC RULES

(71) Applicant: International Business Machines Corporation, Armonk, NY (US)

(72) Inventors: Kathryn Orenstein, Austin, TX (US); Hyun Kyu Seo, Elmsford, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/685,561

(22) Filed: Aug. 24, 2017

(51) Int. Cl.
| | |
|---|---|
| H03G 3/20 | (2006.01) |
| H03G 3/24 | (2006.01) |
| H03G 3/32 | (2006.01) |
| G10L 21/02 | (2013.01) |
| G10L 21/0208 | (2013.01) |

(52) U.S. Cl.
CPC ............ *H03G 3/24* (2013.01); *H03G 3/20* (2013.01); *H03G 3/32* (2013.01); *G10L 21/02* (2013.01); *G10L 21/0208* (2013.01)

(58) Field of Classification Search
CPC .. H03G 3/00; H03G 3/24; H03G 3/32; H03G 3/20; G10L 21/02; G10L 21/0208; G06F 17/00
See application file for complete search history.

(56) References Cited

U.S. PATENT DOCUMENTS

| | | | |
|---|---|---|---|
| 3,431,498 A | 3/1969 | Harold et al. | |
| 4,476,571 A | 10/1984 | Tokumo et al. | |
| 6,169,807 B1 | 1/2001 | Sansur | |
| 8,015,590 B2* | 9/2011 | Chung | G09G 5/005 348/553 |
| 8,116,461 B2 | 2/2012 | L'Esperance et al. | |
| 2006/0229752 A1* | 10/2006 | Chung | H04L 12/2803 700/94 |
| 2009/0062943 A1 | 3/2009 | Nason et al. | |
| 2009/0097665 A1* | 4/2009 | L'Esperance | G10K 11/175 381/57 |
| 2010/0183156 A1* | 7/2010 | Park | G10K 11/178 381/17 |
| 2013/0342669 A1 | 12/2013 | Hsu | |
| 2014/0266600 A1* | 9/2014 | Alberth, Jr. | G05B 11/01 340/5.83 |

(Continued)

FOREIGN PATENT DOCUMENTS

| | | | | |
|---|---|---|---|---|
| WO | 0241664 | 5/2002 | | |
| WO | WO 2014183517 A1 * | 11/2014 | .......... | H04M 1/6041 |

OTHER PUBLICATIONS

Bharitkar et al., "Optimization of the bass management filter parameters for multichannel audio applications," IEEE, Conference Record of the Thirty-Ninth Asilomar Conference on Signals, Systems, and Computers, Oct. 2005, pp. 324-327.

(Continued)

*Primary Examiner* — Duc M Nguyen
(74) *Attorney, Agent, or Firm* — VanLeeuwen & VanLeeuwen; Jeffrey S. LaBaw (57) ABSTRACT

An approach is provided that compares inputs received at a system to a set of rules. The rules include both static rules as well as dynamic rules. The approach retrieves audio adjustments based on the comparison of inputs to the rules. The approach then automatically adjusts an output of an audio system based on the retrieved audio adjustment.

23 Claims, 7 Drawing Sheets

(56) References Cited

U.S. PATENT DOCUMENTS

| | | | | |
|---|---|---|---|---|
| 2014/0294200 A1* | 10/2014 | Baumgarte | ............... | H03G 3/20 |
| | | | | 381/107 |
| 2016/0174011 A1* | 6/2016 | Rider | ....................... | H04S 7/303 |
| | | | | 381/303 |
| 2017/0031420 A1* | 2/2017 | Wong | ................ | H04W 52/0254 |

OTHER PUBLICATIONS

"Enjoying clear sound at a low volume level (Night Mode)," Help Guide for Multi Channel AV Receiver STR-DH750/STR-DH550, Sony Corporation, 2014, 1 page.

"Optimizing the night time listening volume (Night Mode)," Denon, D&M Holdings Inc., 2014, 2 pages.

"Skype lowers volume of all other applications," Skype, Feb. 2013, 9 pages.

* cited by examiner

AUDIO ADJUSTMENT BASED ON DYNAMIC AND STATIC RULES

BACKGROUND

Description of Related Art

Many people enjoy listening to music and watching multimedia content, such as movies and online content, regardless of the time of day. Some modern speaker and home audio entertainment equipment incorporate a "night mode" feature that reduces the bass and volume during night time hours. Traditional "night mode" features are not contextual to the actual situation and environment. First, users often have to manually turn on the "night mode" feature. Second, even if the feature is adjustable, some situations, such as a night time sports event on a weekday night, might require different values for the sound system.

SUMMARY

An approach is provided that compares inputs received at a system to a set of rules. The rules include both static rules as well as dynamic rules. The approach retrieves audio adjustments based on the comparison of inputs to the rules. The approach then automatically adjusts an output of an audio system based on the retrieved audio adjustment.

The foregoing is a summary and thus contains, by necessity, simplifications, generalizations, and omissions of detail; consequently, those skilled in the art will appreciate that the summary is illustrative only and is not intended to be in any way limiting. Other aspects, inventive features, and advantages of the present invention will be apparent in the non-limiting detailed description set forth below.

BRIEF DESCRIPTION OF THE DRAWINGS

The present invention may be better understood, and its numerous objects, features, and advantages made apparent to those skilled in the art by referencing the accompanying drawings, wherein.

DETAILED DESCRIPTION

FIG. 3-7 depict an approach to perform audio adjustments based on dynamic and static rules. The approach described herein is aimed to create a rule system based upon a set of given static and dynamic values. The combination of the static and dynamic data act as actuators to manipulate values appropriate of a sound system.

As used herein, "dynamic" rules are rules that pertain to the current environment where the sound system is outputting sound, such as music, sound from a television or other multimedia device, etc. Dynamic rules include rules pertaining to the number of people present in the area proximate to the sound system, the ages of the people in the area proximate to the sound system, specific identifiable individuals in the area proximate to the sound system (such as an identified grandfather, child, etc.), etc. On the other hand, static rules are rules that pertain to non-environmental factors such as the time of day, the day of the week, and the like.

Automatic Dynamic Range Control (ADRC) and Automatic Volume Control (AVC) are controls based on a combination of dynamic thresholds and static rules to adjust the volume of sound emitted from a television/home theater system so that the user can set it up once and let the system handle controlling volume changes. In addition to being set by the user, the control thresholds can also be preset values from a manufacturer. Examples of values can include noise gate, volume, compression bass, treble, etc.

Data is provided by input devices, such as by the content itself, microphones, cameras, and/or composite devices, such as motion sensors, smart phones, personal digital assistants, and the like. Thresholds are controlled by the users as well as being preset as defaults by a manufacturer. The data potential from such devices include content, the number of people in the room, etc. to affect the audio level dynamically.

For example, a system might be set so that when dynamic data reads one person in the room and the day of the week (static data) is between Sunday and Thursday and the time of day (static data) is between 10 pm and 6 am), then the system lowers the peak range of noise gate to X, and sets the maximum volume to Y. In another example, dynamic data reads 5 or more people, the day of the week is between Friday and Saturday, and the time of day is between 10 pm-6 am, with the system responsively getting the amount of ambient noise received at the microphone and adds a value based on the noise gathered at the microphone to adjust the system volume. In another example, a child is detected via a digital camera and the day of the week is between Monday and Friday and the time of day is between 6 am and 6 pm), with the resulting system action to be to limit the system volume to a maximum amount appropriate for a child.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The detailed description has been presented for purposes of illustration, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As will be appreciated by one skilled in the art, aspects may be embodied as a system, method or computer program product. Accordingly, aspects may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electromagnetic, optical, or any suitable combination thereof. A computer readable signal medium may be any computer readable medium that is not a computer readable storage medium and that can communicate, propagate, or transport a program for use by or in connection with an instruction execution system, apparatus, or device. As used herein, a computer readable storage medium does not include a computer readable signal medium.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The following detailed description will generally follow the summary, as set forth above, further explaining and expanding the definitions of the various aspects and embodiments as necessary. To this end, this detailed description first sets forth a computing environment in FIG. 1 that is suitable to implement the software and/or hardware techniques associated with the disclosure. A networked environment is illustrated in FIG. 2 as an extension of the basic computing environment, to emphasize that modern computing techniques can be performed across multiple discrete devices.

Figure 1:
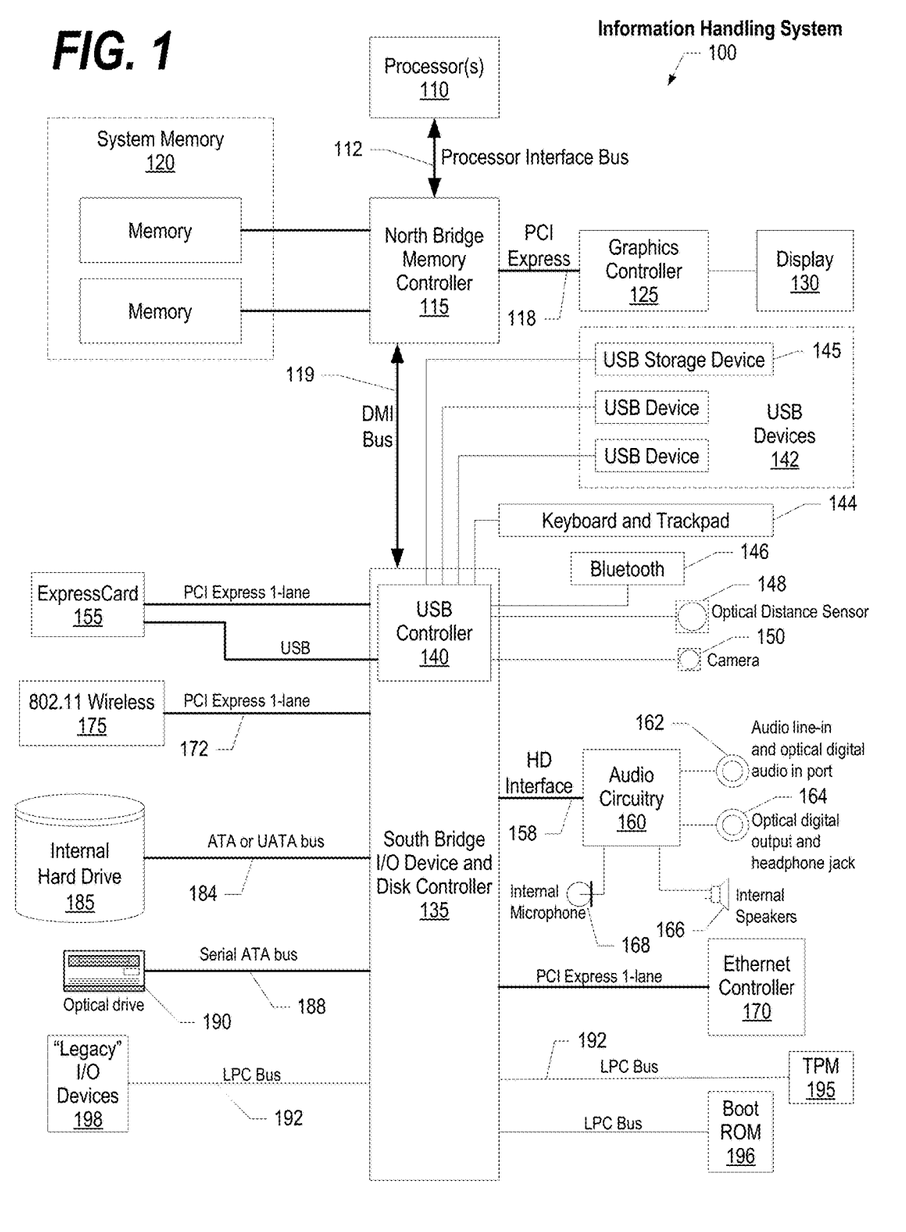
FIG. 1 depicts a block diagram of a network of data processing systems in which illustrative embodiments may be implemented.
Figure 2:
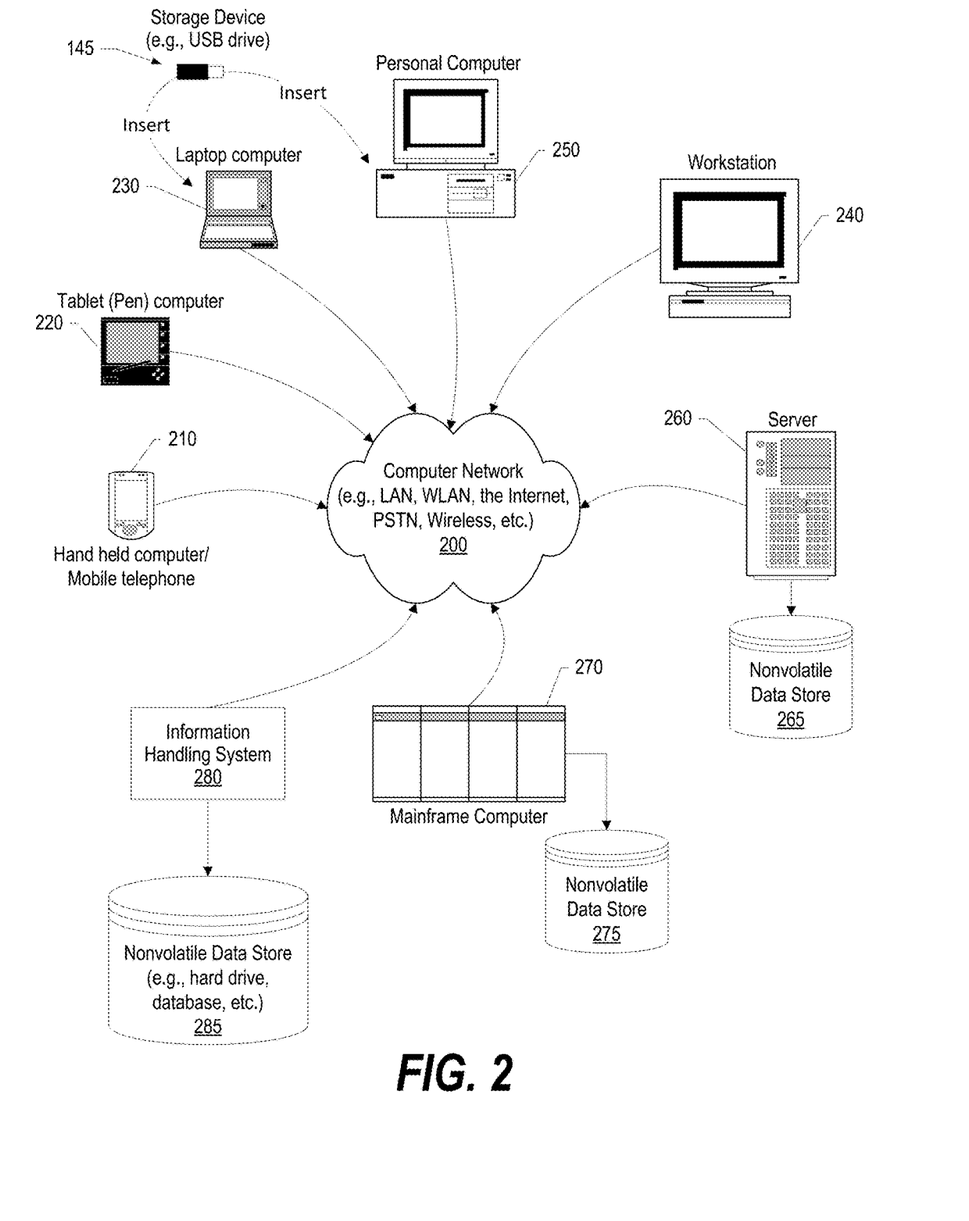
FIG. 2 depicts a block diagram of a data processing system in which illustrative embodiments may be implemented.

FIG. 1 illustrates information handling system 100, which is a simplified example of a computer system capable of performing the computing operations described herein. Information handling system 100 includes one or more processors 110 coupled to processor interface bus 112. Processor interface bus 112 connects processors 110 to Northbridge 115, which is also known as the Memory Controller Hub (MCH). Northbridge 115 connects to system memory 120 and provides a means for processor(s) 110 to access the system memory. Graphics controller 125 also connects to Northbridge 115. In one embodiment, PCI Express bus 118 connects Northbridge 115 to graphics controller 125. Graphics controller 125 connects to display device 130, such as a computer monitor.

Northbridge 115 and Southbridge 135 connect to each other using bus 119. In one embodiment, the bus is a Direct Media Interface (DMI) bus that transfers data at high speeds in each direction between Northbridge 115 and Southbridge 135. In another embodiment, a Peripheral Component Interconnect (PCI) bus connects the Northbridge and the Southbridge. Southbridge 135, also known as the I/O Controller Hub (ICH) is a chip that generally implements capabilities that operate at slower speeds than the capabilities provided by the Northbridge. Southbridge 135 typically provides various busses used to connect various components. These busses include, for example, PCI and PCI Express busses, an ISA bus, a System Management Bus (SMBus or SMB), and/or a Low Pin Count (LPC) bus. The LPC bus often connects low-bandwidth devices, such as boot ROM 196 and "legacy" I/O devices (using a "super I/O" chip). The "legacy" I/O devices (198) can include, for example, serial and parallel ports, keyboard, mouse, and/or a floppy disk controller. The LPC bus also connects Southbridge 135 to Trusted Platform Module (TPM) 195. Other components often included in Southbridge 135 include a Direct Memory Access (DMA) controller, a Programmable Interrupt Controller (PIC), and a storage device controller, which connects Southbridge 135 to nonvolatile storage device 185, such as a hard disk drive, using bus 184.

ExpressCard 155 is a slot that connects hot-pluggable devices to the information handling system. ExpressCard 155 supports both PCI Express and USB connectivity as it connects to Southbridge 135 using both the Universal Serial Bus (USB) the PCI Express bus. Southbridge 135 includes USB Controller 140 that provides USB connectivity to devices that connect to the USB. These devices include webcam (camera) 150, infrared (IR) receiver 148, keyboard and trackpad 144, and Bluetooth device 146, which provides for wireless personal area networks (PANs). USB Controller 140 also provides USB connectivity to other miscellaneous USB connected devices 142, such as a mouse, removable nonvolatile storage device 145, modems, network cards, ISDN connectors, fax, printers, USB hubs, and many other types of USB connected devices. While removable nonvolatile storage device 145 is shown as a USB-connected device, removable nonvolatile storage device 145 could be connected using a different interface, such as a Firewire interface, etcetera.

Wireless Local Area Network (LAN) device 175 connects to Southbridge 135 via the PCI or PCI Express bus 172. LAN device 175 typically implements one of the IEEE 802.11 standards of over-the-air modulation techniques that all use the same protocol to wireless communicate between information handling system 100 and another computer system or device. Optical storage device 190 connects to Southbridge 135 using Serial ATA (SATA) bus 188. Serial ATA adapters and devices communicate over a high-speed serial link. The Serial ATA bus also connects Southbridge 135 to other forms of storage devices, such as hard disk drives. Audio circuitry 160, such as a sound card, connects to Southbridge 135 via bus 158. Audio circuitry 160 also provides functionality such as audio line-in and optical digital audio in port 162, optical digital output and headphone jack 164, internal speakers 166, and internal microphone 168. Ethernet controller 170 connects to Southbridge 135 using a bus, such as the PCI or PCI Express bus. Ethernet controller 170 connects information handling system 100 to a computer network, such as a Local Area Network (LAN), the Internet, and other public and private computer networks.

While FIG. 1 shows one information handling system, an information handling system may take many forms. For example, an information handling system may take the form of a desktop, server, portable, laptop, notebook, or other form factor computer or data processing system. In addition, an information handling system may take other form factors such as a personal digital assistant (PDA), a gaming device, ATM machine, a portable telephone device, a communication device or other devices that include a processor and memory.

The Trusted Platform Module (TPM 195) shown in FIG. 1 and described herein to provide security functions is but one example of a hardware security module (HSM). Therefore, the TPM described and claimed herein includes any type of HSM including, but not limited to, hardware security devices that conform to the Trusted Computing Groups (TCG) standard, and entitled "Trusted Platform Module (TPM) Specification Version 1.2." The TPM is a hardware security subsystem that may be incorporated into any number of information handling systems, such as those outlined in FIG. 2.

FIG. 2 provides an extension of the information handling system environment shown in FIG. 1 to illustrate that the methods described herein can be performed on a wide variety of information handling systems that operate in a networked environment. Types of information handling systems range from small handheld devices, such as handheld computer/mobile telephone 210 to large mainframe systems, such as mainframe computer 270. Examples of handheld computer 210 include personal digital assistants (PDAs), personal entertainment devices, such as MP3 players, portable televisions, and compact disc players. Other examples of information handling systems include pen, or tablet, computer 220, laptop, or notebook, computer 230, workstation 240, personal computer system 250, and server 260. Other types of information handling systems that are not individually shown in FIG. 2 are represented by information handling system 280. As shown, the various information handling systems can be networked together using computer network 200. Types of computer network that can be used to interconnect the various information handling systems include Local Area Networks (LANs), Wireless Local Area Networks (WLANs), the Internet, the Public Switched Telephone Network (PSTN), other wireless networks, and any other network topology that can be used to interconnect the information handling systems. Many of the information handling systems include nonvolatile data stores, such as hard drives and/or nonvolatile memory. Some of the information handling systems shown in FIG. 2 depicts separate nonvolatile data stores (server 260 utilizes nonvolatile data store 265, mainframe computer 270 utilizes nonvolatile data store 275, and information handling system 280 utilizes nonvolatile data store 285). The nonvolatile data store can be a component that is external to the various information handling systems or can be internal to one of the information handling systems. In addition, removable nonvolatile storage device 145 can be shared among two or more information handling systems using various techniques, such as connecting the removable nonvolatile storage device 145 to a USB port or other connector of the information handling systems.

Figure 3:
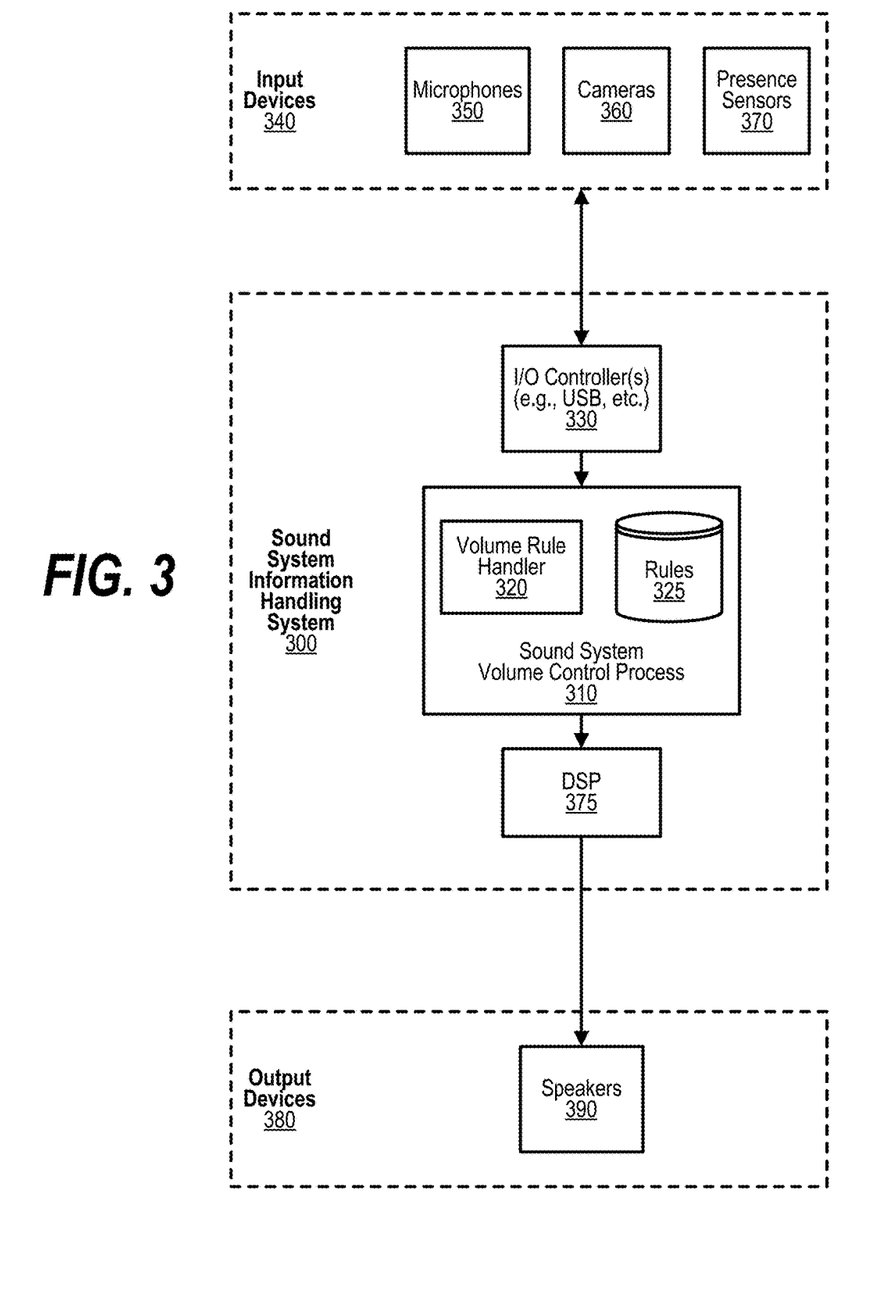
FIG. 3 depicts a system diagram showing the various components used in providing audio adjustment based on dynamic and static rules.

FIG. 3 depicts a system diagram showing the various components used in providing audio adjustment based on dynamic and static rules. Sound information handling system 300 receives inputs from input devices 340, such as from microphones 350, cameras 360, and presence sensors 370. These inputs are, in one embodiment, received by one or more input/output (I/O) controllers 330, such as Universal Serial Bus (USB) controllers and the like. As used herein, "dynamic" rules are rules that pertain to the current environment where the sound system is outputting sound, such as music, sound from a television or other multimedia device, etc. Dynamic rules include rules pertaining to the number of people present in the area proximate to the sound system, the ages of the people in the area proximate to the sound system, specific identifiable individuals in the area proximate to the sound system (such as an identified grandfather, child, etc.), etc. On the other hand, static rules are rules that pertain to non-environmental factors such as the time of day, the day of the week, and the like.

Sound information handling system 300 compares a set of inputs received from input devices 340 to a set of rules that are stored in rules data store 325. The rules include both dynamic rules as well as static rules. A dynamic rule corresponds with dynamic changes detected to the environment in which the sound information handling system is operating. For example, a dynamic rule might be to increase the volume to a certain level when a certain number of people are detected in proximity to the sound information handling system. Static rules, on the other hand, apply to conditions that are static, or independent from, the environment in which the sound information handling system is operating. For example, static rules might indicate to decrease the volume levels of the sound information handling system when the time of day is a night time hour and the day of the week is a weekday, such as after nine o'clock PM on a weeknight.

Volume rule handler 320 is a process running within sound system volume control process 310 that performs the comparison and retrieves audio adjustments based on the comparison of the rules with the inputs received at the input devices. The sound system volume control process automatically adjusts an output of an audio system based on the retrieved audio adjustment. Digital signal processor 375 directs audio output (e.g., analog output, etc.) to output devices 380, such as audio speakers 390.

In one embodiment, the audio adjustment is an automatic dynamic range control that sets a maximum volume of the audio system. In one embodiment, the audio adjustment is an automatic volume control that adjusts a volume of the audio system.

In one embodiment, one of the rules is a predefined number of people that are proximate to the audio system. In this embodiment, the system identifies a current number of people from a set of sensor data included in the inputs. The process compares the identified current number of people with the predefined number of people, with the comparing corresponding to one of the rules, and with the retrieved audio adjustment being retrieved from the matching rule.

In one embodiment, one of the rules is a predefined person, such as a grandfather living in the home, that is found to be proximate to the audio system. In this embodiment, the system identifies people that are currently proximate to the audio system, with the identification being based on the received sensor data from the inputs. The process compares a predefined set of sensor data that corresponds to the predefined person, such as an image of the grandfather, with the one or more sets of received sensor data, such as a digital image captured by a digital camera accessible from the system. When the system determines that the predefined person is currently proximate to the audio system, then an adjustment associated with a selected rule corresponding to this person rule is applied to the audio system.

In one embodiment, the system applies analytic analysis to the inputs to identify quantities related to the set of rules, such as a number of people, a number of children, etc. The process then utilizes the identified quantities to select the adjustment to the output of the audio system corresponding to one of the rules.

In one embodiment, the inputs are selected from audio from a microphone, a digital image from a digital camera, a presence data received from a presence sensor, a date/time from a digital clock, a number of people, a particular person, and an approximate age of a person.

Figure 4:
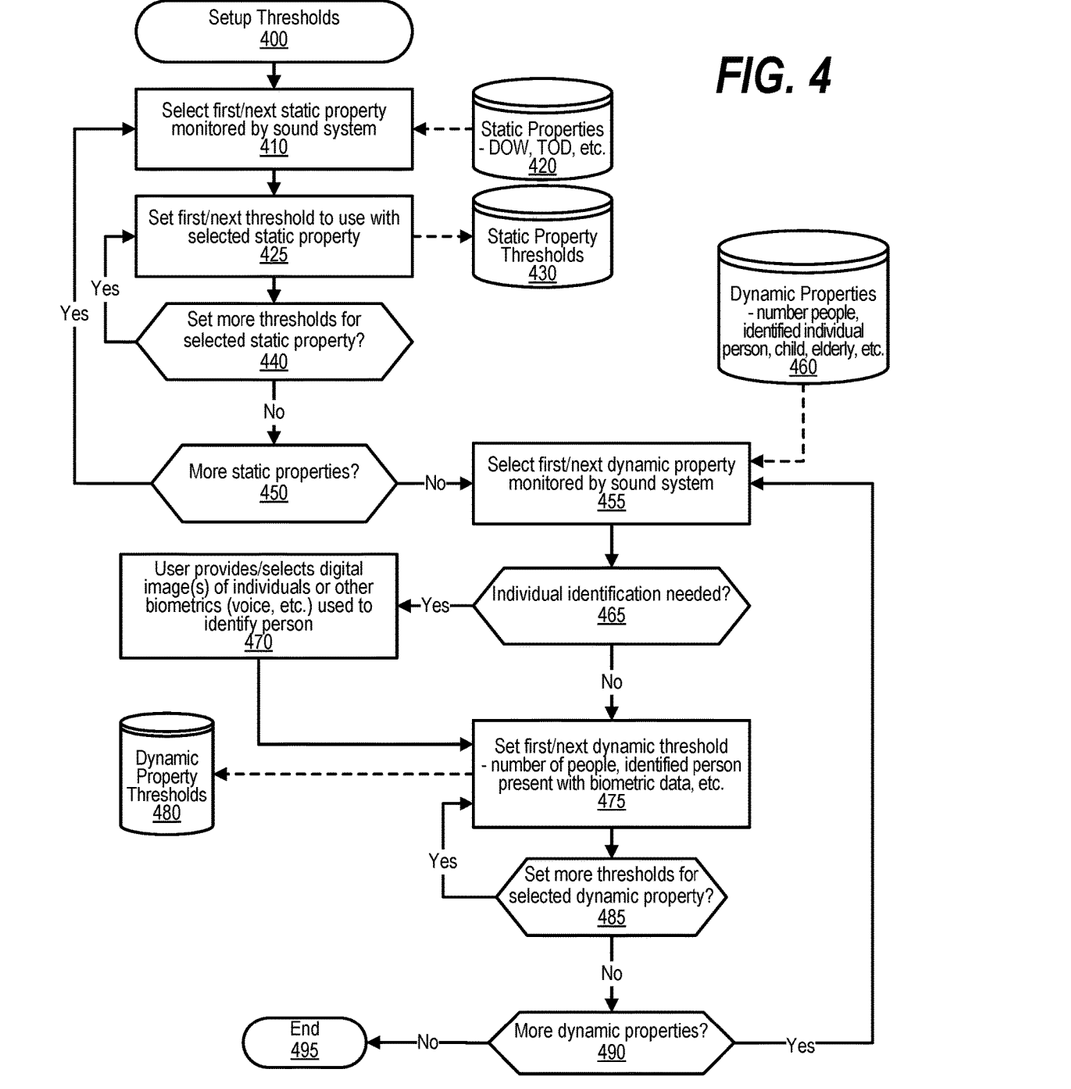
FIG. 4 depicts a flowchart of a process that is performed to setup thresholds used by the system.

FIG. 4 depicts a flowchart of a process that is performed to setup thresholds used by the system. FIG. 4 processing commences at 400 and shows the steps taken by a process that sets up static and dynamic thresholds utilized by various components used in providing audio adjustment based on dynamic and static rules. At step 410, the process selects the first static property monitored by sound system. The static properties are retrieved from data store 420. Static properties can include properties such as the day of the week, the time of day, and the like. At step 425, the process sets the first threshold to use with selected static property. For example, a static threshold might be when the time of day is after nine o'clock in the evening. The process stores the static threshold data in data store 430. The process next determines whether the user wishes to set more thresholds for the selected static property (decision 440). If the user wishes to set more thresholds for the selected static property, then decision 440 branches to the 'yes' branch which loops back to step 425 to receive the next threshold data for the currently selected static property. This looping continues until the user does not wish to set up any more thresholds for the selected static property, at which point decision 440 branches to the 'no' branch exiting the loop. The process next determines as to whether the user wishes to set up additional static properties (decision 450). If the user wishes to set up additional static properties, then decision 450 branches to the 'yes' branch which loops back to step 410 to receive the next static property selection from the user. This looping continues until the user is finished selecting static properties to set up, at which point decision 450 branches to the 'no' branch exiting the loop.

At step 455, the process selects the first dynamic property monitored by sound system. An example of a dynamic property is the number of people proximate to the sound system output. A determination is made, based on a user input, as to whether individual identification is needed for the dynamic property (decision 465). For example, if the dynamic property is an individual identification, such as to increase the volume when a grandfather with poor hearing is proximate to the sound system, then identification of the grandfather can be made. When individual identification is needed, then decision 465 branches to the 'yes' branch whereupon, at step 470, the process receives a user selection of biometric data, such as a digital image, of the individuals that are being identified. On the other hand, if individual identification of individuals, then decision 465 branches to the 'no' branch bypassing step 470.

At step 475, the process sets the first dynamic threshold corresponding to the selected dynamic property. The dynamic threshold might be the number of people proximate to the sound system, an identified person proximate to the sound system, and the like. The process stores the dynamic property threshold data in data store 480. The process next determines as to whether the user wishes to set additional thresholds for the selected static property (decision 485). If the user wishes to set additional thresholds for the selected static property, then decision 485 branches to the 'yes' branch which loops back to step 475 to set the next threshold for the selected dynamic property, such as another identified individual. This looping continues until the user is finished setting dynamic thresholds for the property, at which point decision 485 branches to the 'no' branch exiting the loop. The process determines as to whether the user wishes to set up additional dynamic properties (decision 490). If the user wishes to set up additional dynamic properties, then decision 490 branches to the 'yes' branch which loops back to step 455 to select the next dynamic property and process thresholds for the property as described above. This looping continues until the user is finished setting up dynamic properties, at which point decision 490 branches to the 'no' branch exiting the loop. FIG. 4 set up processing thereafter ends at 495.

Figure 5:
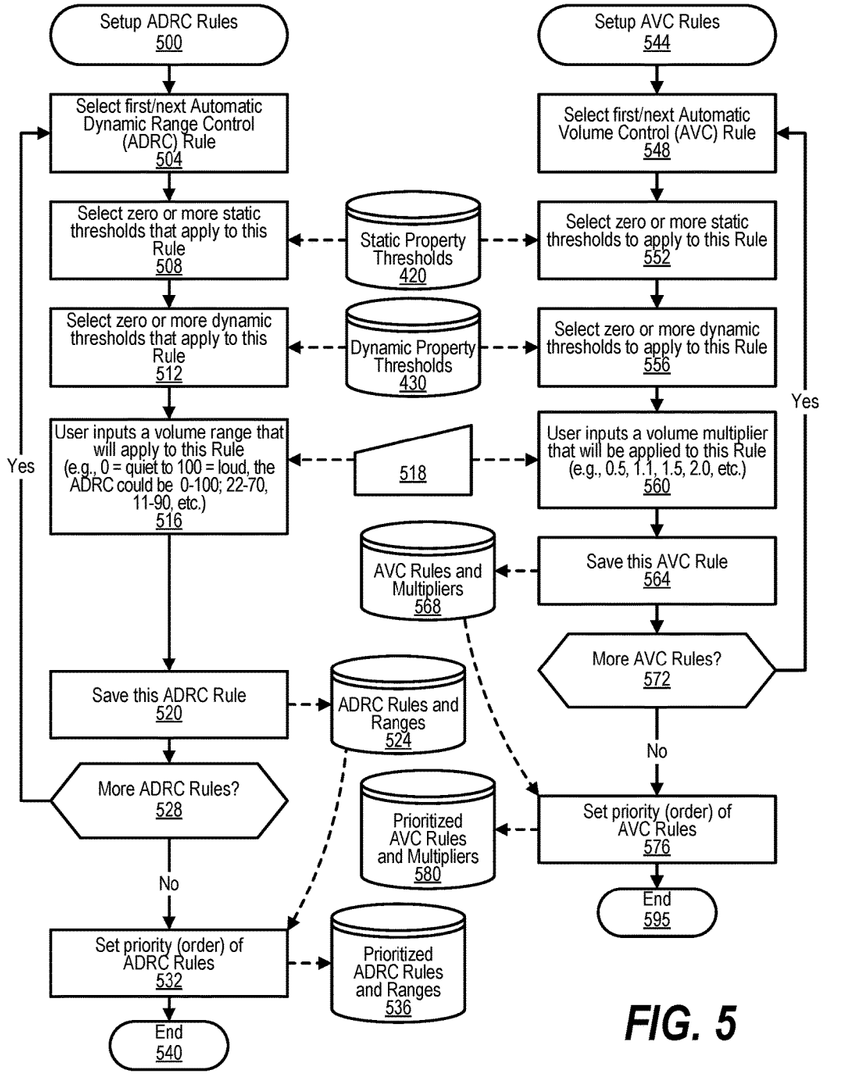
FIG. 5 depicts flowcharts used to setup automatic dynamic range control (ADRC) and automatic volume control (AVC) rules.

FIG. 5 depicts flowcharts used to setup automatic dynamic range control (ADRC) and automatic volume control (AVC) rules. FIG. 5 processing commences at 500 and shows the steps taken by a process that sets up Automatic Dynamic Range Control (ADRC) Rules and Automatic Volume Control Rules. ADRC is a range within which the sound system operates, while AVC is an automatic control adjustment to the volume of the system. For example, if children are detected proximate to the sounds system, then an ADRC rule might be established to limit the volume range to half of the normal volume range to protect the children's hearing. Likewise, if a particular person with poor hearing is detected proximate to the sound system, the system my invoke an AVC rule to automatically boost the volume by a particular amount, such as by twenty percent, etc. Steps 500-540 show the steps used to set up the ADRC Rules, while steps 544-595 show the steps used to set up the AVC Rules. At step 504, the process selects the first ADRC Rule that is being established. At step 508, the user of the process selects any number of static thresholds that apply to this Rule. An option is to have zero static thresholds apply to this Rule. The static property thresholds are selected from data store 420. At step 512, the user of the process selects any number of dynamic thresholds that apply to this Rule. Again, an option is to have zero static thresholds apply to this Rule. The dynamic property thresholds are selected from data store 430.

At step 516, the user of the process inputs a volume range that will apply to this Rule For example, in a system where zero is silent and one hundred is the maximum volume, the ADRC could be set to a range of 22 to 70, 11 to 90, etc. In one embodiment, the user provides manual input 518 to set the ranges. At step 520, the process saves this ADRC Rule with the associated static property thresholds (if any), dynamic property thresholds (if any) and volume range to data store 524. The process determines as to whether the user wishes to establish more ADRC Rules (decision 528). If the user wishes to establish more ADRC Rules, then decision 528 branches to the 'yes' branch which loops back to step 504 to begin setting up the next ADRC rule as described above. This looping continues until the user does not wish to establish any more ADRC Rules, at which point decision 528 branches to the 'no' branch exiting the loop.

At step 532, the process sets priority (order) of ADRC Rules. In one embodiment, the first ADRC rule that matches the available inputs in the current environment is the ADRC rule that is used with other rules being ignored. In this embodiment, the user prioritizes the ADRC Rules stored in data store 524 by ordering the preferred Rules to the top and the less preferred rules towards the bottom of the list. The prioritized list of ADRC Rules is stored in data store 536. FIG. 5 processing of ADRC Rules setup thereafter ends at 540.

FIG. 5 processing to set up Automatic Volume Control (AVC) Rules commences at 544 and shows the steps taken by a process that setup AVC Rules. At step 548, the user of the process selects the first Automatic Volume Control (AVC) Rule. At step 552, the user of the process selects any number of static thresholds that apply to this AVC Rule. An option is to have zero static thresholds apply to this Rule. The static property thresholds are selected from data store 420 the user of the process selects any number of dynamic thresholds that apply to this Rule. Again, an option is to have zero static thresholds apply to this Rule. The dynamic property thresholds are selected from data store 430.

At step 560, the user of the process inputs a volume multiplier that will be applied to this Rule. For example, the multiplier could be set to decrease the volume by ten percent when a child or person with sensitive hearing is detected, while a multiplier to increase the volume by twenty percent can be set when a person that has difficulty hearing is detected. In one embodiment, the user provides manual input 518 to set the multiplier. Which of the Rules that is utilized when both the sensitive hearing individual and hard-of-hearing individual are both detected in the room is determined by the ordering, or priority, of the AVC Rules that is performed at step 576, described below. At step 564, the process saves this AVC Rule with the associated static property thresholds (if any), dynamic property thresholds (if any) and volume multiplier to data store 568. The process determines as to whether the user wishes to establish more AVC Rules (decision 572). If the user wishes to establish more AVC Rules, then decision 572 branches to the 'yes' branch which loops back to step 548 to begin setting up the next AVC rule as described above. This looping continues until the user does not wish to establish any more AVC Rules, at which point decision 572 branches to the 'no' branch exiting the loop.

At step 576, the process sets priority (order) of AVC Rules. In one embodiment, the first AVC rule that matches the available inputs in the current environment is the AVC rule that is used with other rules being ignored. In this embodiment, the user prioritizes the AVC Rules stored in data store 568 by ordering the preferred Rules to the top and the less preferred rules towards the bottom of the list. The prioritized list of AVC Rules is stored in data store 580. FIG. 5 processing thereafter ends at 595.

Figure 6:
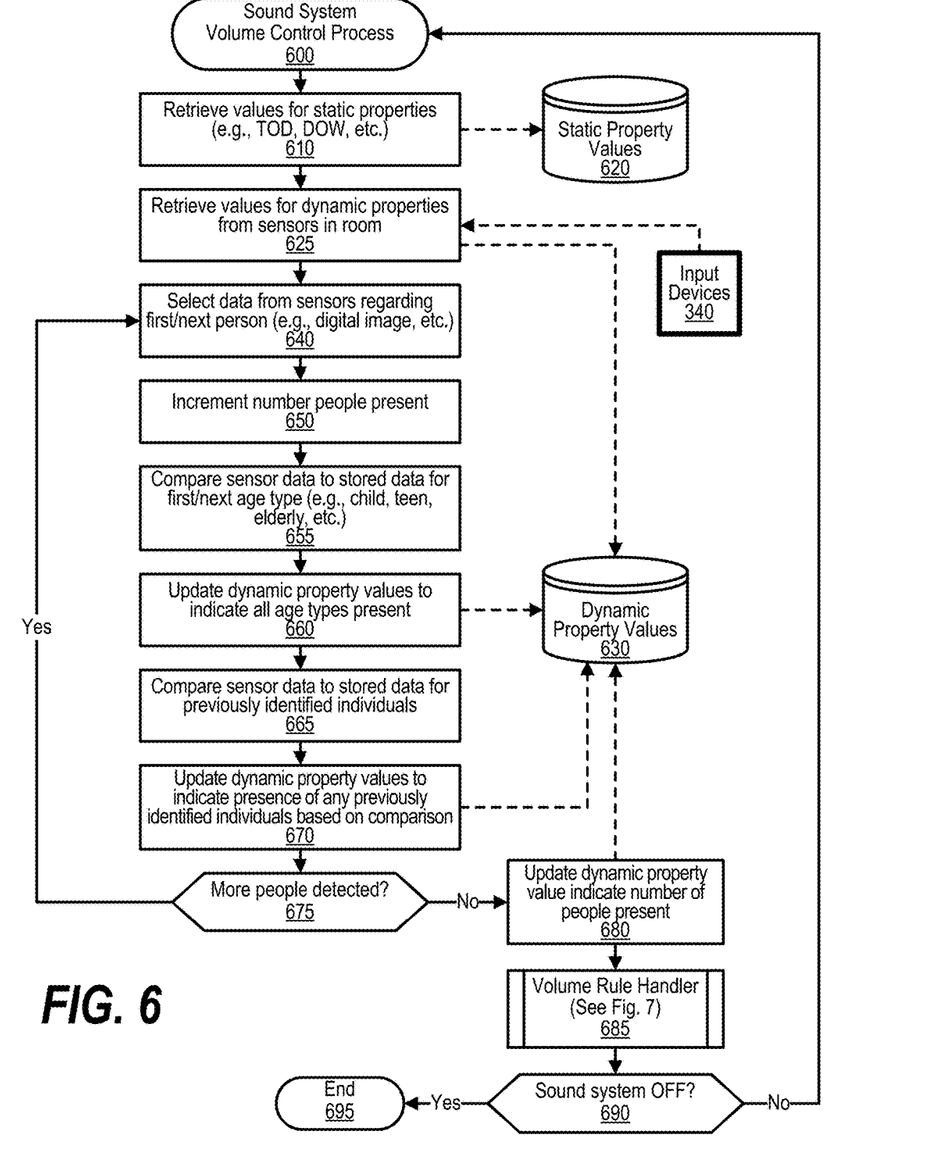
FIG. 6 depicts a flowchart of a process that monitors sound from a sound system and adjusts volume according to established ADRC and AVC rules.

FIG. 6 depicts a flowchart of a process that monitors sound from a sound system and adjusts volume according to established ADRC and AVC rules. FIG. 6 processing commences at 600 and shows the steps taken by a process that performs the Sound System Volume Control Process. At step 610, the process retrieves the values for the static properties that have been established. Examples of static properties include time of day, day of the week, day of the year, and the like, and are independent from environmental (dynamic) data proximate to the sound system, such as number of people present and identification or categorization of individuals that are present. The static property values are stored in data store 620. At step 625, the process retrieves the current values for the dynamic properties from the sensors in room that are associated with input devices 340, such as proximity sensors, digital cameras, microphones, and other devices used to detect individuals proximate to the sound system. The retrieved values are stored in data store 630.

At step 640, the process selects data from sensors (e.g., digital image, etc.) regarding the first person detected in the area proximate to the sound system. At step 650, the process increments the number people present by one. At step 655, the process compares the sensor data to stored data for the first age type of the selected person. For example, comparing the individuals features to that of an infant, child, teenager, adult, elderly, or the like. At step 660, the process updates dynamic property values to indicate the age types currently present in the area proximate to the sound system. The updated dynamic property values are stored in data store

630. At step 665, the process compares the sensor data to stored data for previously identified individuals. For example, a previously identified individual might be a grandfather with poor hearing so that the volume can be adjusted accordingly so that the grandfather can better hear the sound system. At step 670, the process updates dynamic property values to indicate presence of any previously identified individuals based on comparison. The updated dynamic property values are stored in data store 630. The process determines whether more people have been detected in the area proximate to the sound system (decision 675). If more people have been detected in the area proximate to the sound system, then decision 675 branches to the 'yes' branch which loops back to step 640 to process the next person (categorize the person's age and identification of the individual if established). This looping continues until no more people are detected, at which point decision 675 branches to the 'no' branch exiting the loop.

At step 680, the process updates dynamic property value indicate the total number of people present. The total number of people currently present is stored in data store 630. Thresholds can be established to adjust the ADRC and/or the AVC based upon the total number of people present. At predefined process 685, the process performs the Volume Rule Handler routine (see FIG. 7 and corresponding text for processing details). The process determines as to whether the sound system has been turned OFF (decision 690). If the sound system has not been turned OFF, then decision 690 branches to the 'no' branch which loops back to restart the process. This looping continues until the sound system is turned OFF, at which point decision 690 branches to the 'no' branch exiting the loop. FIG. 6 processing thereafter ends at 695.

Figure 7:
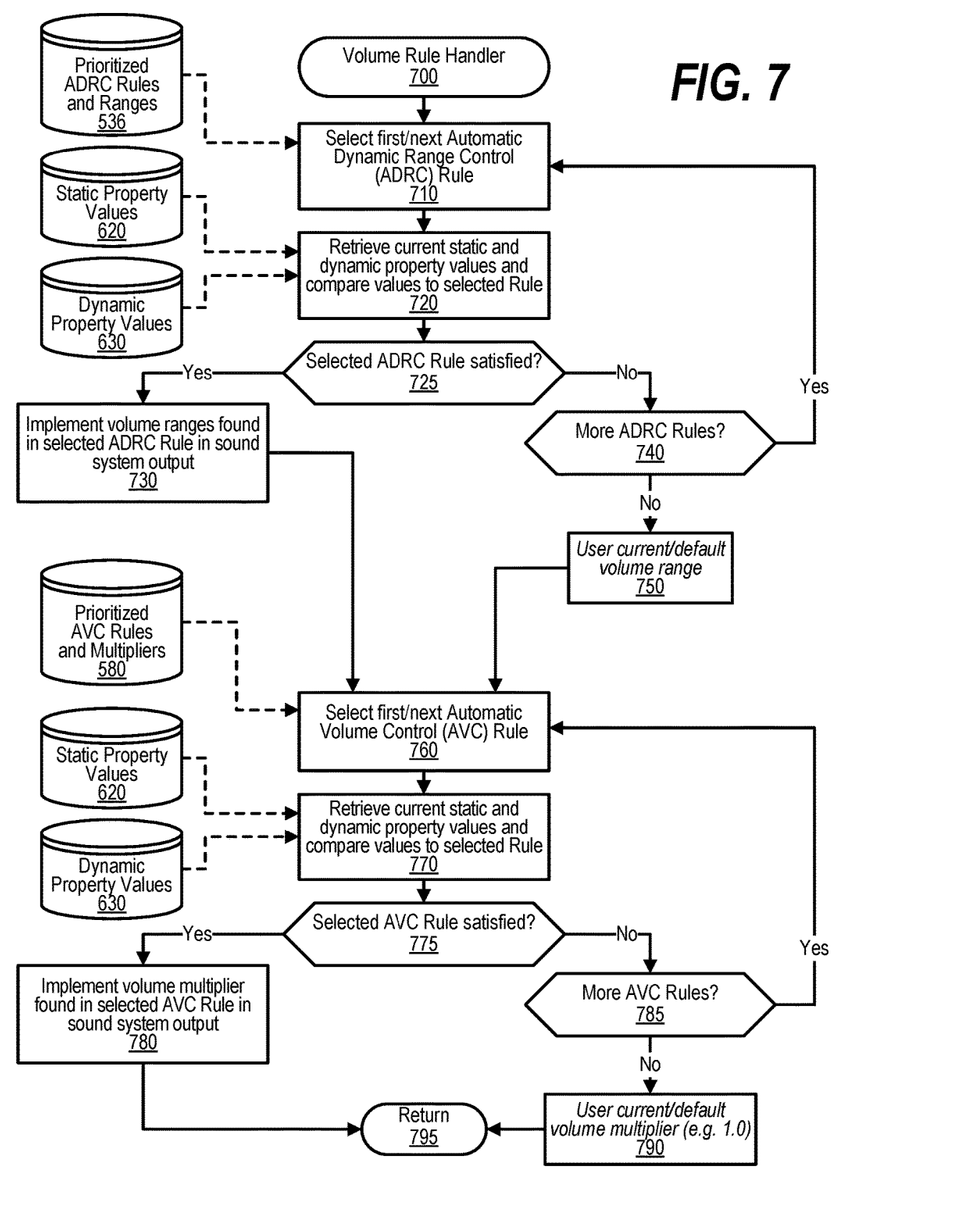
FIG. 7 depicts a flowchart of a process that handles audio volume rules.

FIG. 7 depicts a flowchart of a process that handles audio volume rules. FIG. 7 processing commences at 700 and shows the steps taken by a process that performs the Volume Rule Handler process. At step 710, the process selects the first Automatic Dynamic Range Control (ADRC) Rule from data store 536. At step 720, the process retrieves the current static and dynamic property values from data stores 620 and 630, respectively, and compares the retrieved values to the ADRC rule that was selected at step 710.

The process determines as to whether the selected ADRC Rule has been satisfied by the current static and dynamic property values (decision 725). If the selected ADRC Rule has been satisfied by the current static and dynamic property values, then decision 725 branches to the 'yes' branch to perform step 730 and does not process any more ADRC rules. On the other hand, if the selected ADRC Rule is not satisfied by the current static and dynamic property values, then decision 725 branches to the 'no' branch whereupon the process determines as to whether there are more ADRC Rules to process (decision 740). If there are more ADRC Rules to process, then decision 740 branches to the 'yes' branch which loops back to step 710 to retrieve the next ADRC Rule and compare it to the current static and dynamic property values. This looping continues until either a selected ADRC Rule is satisfied (with decision 725 branching to the 'yes' branch) or until there are no more ADRC Rules to process, at which point decision 740 branches to the 'no' branch exiting the loop and, as shown in step 750, the process will then use the current or default volume ranges that are in place for the system. At step 730, when an ADRC Rule is satisfied, the process implements the volume ranges found in the selected ADRC Rule at the sound system output (e.g., setting the volume range to half the possible volume range, etc.).

At step 760, the process selects the first Automatic Volume Control (AVC) Rule from data store 580. At step 770, the process retrieves the current static and dynamic property values from data stores 620 and 630, respectively, and compares the retrieved values to the ADRC rule that was selected at step 760.

The process determines as to whether the selected AVC Rule has been satisfied by the current static and dynamic property values (decision 775). If the selected AVC Rule has been satisfied by the current static and dynamic property values, then decision 775 branches to the 'yes' branch to perform step 780 and does not process any more AVC rules. On the other hand, if the selected AVC Rule is not satisfied by the current static and dynamic property values, then decision 725 branches to the 'no' branch whereupon the process determines as to whether there are more AVC Rules to process (decision 785). If there are more AVC Rules to process, then decision 785 branches to the 'yes' branch which loops back to step 760 to retrieve the next AVC Rule and compare it to the current static and dynamic property values. This looping continues until either a selected AVC Rule is satisfied (with decision 775 branching to the 'yes' branch) or until there are no more AVC Rules to process, at which point decision 785 branches to the 'no' branch exiting the loop and, as shown in step 790, the process will then use the current or default volume ranges that are in place for the system. At step 780, when an AVC Rule is satisfied, the process implements the volume multiplier found in the selected AVC Rule at the sound system output (e.g., automatically increasing the volume by twenty percent, etc.). FIG. 7 processing thereafter returns to the calling routine (see FIG. 6) at 795.

While particular embodiments have been shown and described, it will be obvious to those skilled in the art that, based upon the teachings herein, that changes and modifications may be made without departing from this invention and its broader aspects. Therefore, the appended claims are to encompass within their scope all such changes and modifications as are within the true spirit and scope of this invention. Furthermore, it is to be understood that the invention is solely defined by the appended claims. It will be understood by those with skill in the art that if a specific number of an introduced claim element is intended, such intent will be explicitly recited in the claim, and in the absence of such recitation no such limitation is present. For non-limiting example, as an aid to understanding, the following appended claims contain usage of the introductory phrases "at least one" and "one or more" to introduce claim elements. However, the use of such phrases should not be construed to imply that the introduction of a claim element by the indefinite articles "a" or "an" limits any particular claim containing such introduced claim element to inventions containing only one such element, even when the same claim includes the introductory phrases "one or more" or "at least one" and indefinite articles such as "a" or "an"; the same holds true for the use in the claims of definite articles.

What is claimed is:

1. A method implemented by an information handling system that includes a processor and a memory accessible by the processor, the method comprising:
   prioritizing a plurality of dynamic rules and a plurality of static rules, wherein the dynamic rules and the static rules are included in a set of rules applied to an output of an audio system;
   comparing a set of one or more inputs to the set of rules, wherein the comparing is performed according to the prioritization of the dynamic rules and the static rules;

retrieving at least one audio adjustment based on the comparisons; and automatically adjusting the output of the audio system based on the retrieved audio adjustment.

2. The method of claim 1, wherein the audio adjustment is an automatic dynamic range control that sets a maximum volume of the audio system.

3. The method of claim 1, wherein the audio adjustment is an automatic volume control that adjusts a volume of the audio system.

4. The method of claim 1 wherein one of the dynamic rules is a predefined number of people proximate to the audio system, and wherein the method further comprises:

identifying a current number of people from a set of sensor data included in the inputs; and comparing the identified current number of people with the predefined number of people, wherein the comparing corresponds to a selected one of the dynamic rules, and wherein the retrieved audio adjustment is retrieved from the selected dynamic rule.

5. The method of claim 1 wherein a selected one of the dynamic rules is a predefined person being proximate to the audio system, and wherein the method further comprises:

identifying one or more people currently proximate to the audio system, wherein the identifying is based on one or more sets of received sensor data;

comparing a predefined set of sensor data that corresponds to the predefined person with the one or more sets of received sensor data; and in response to determining, based on the comparison, that the predefined person is currently proximate to the audio system, applying an adjustment associated with the selected dynamic rule to the audio system.

6. The method of claim 1 further comprising:

applying analytic analysis to the inputs to identify quantities related to the set of rules; and utilizing the identified quantities to select the adjustment to the output of the audio system corresponding to one of the rules.

7. The method of claim 1 wherein at least one of the inputs is selected from a group consisting of audio from a microphone, a digital image from a digital camera, a presence data received from a presence sensor, a date/time from a digital clock, a number of people, a particular person, and an approximate age of a person.

8. The method of claim 1 wherein the plurality of dynamic rules are prioritized at a higher priority level than the plurality of static rules.

9. An information handling system comprising:

one or more processors;

a memory coupled to at least one of the processors;

an audio output, wherein one or more audio adjustments to the audio output are accessible by at least one of the processors;

one or more input receivers that receive input data and store the input data in the memory; and a set of instructions stored in the memory and executed by at least one of the processors to perform actions comprising:

prioritizing a plurality of dynamic rules and a plurality of static rules, wherein the dynamic rules and the static rules are included in a set of rules applied to the audio outputs;

comparing a set of one or more inputs to the set of rules, wherein the comparing is performed according to the prioritization of the dynamic rules and the static rules;

retrieving at least one audio adjustment based on the comparisons; and automatically adjusting one of the audio adjustments based on the retrieved audio adjustment.

10. The information handling system of claim 9, wherein the audio adjustment is an automatic dynamic range control that sets a maximum volume of the audio system.

11. The information handling system of claim 9, wherein the audio adjustment is an automatic volume control that adjusts a volume of the audio system.

12. The information handling system of claim 9 wherein one of the dynamic rules is a predefined number of people proximate to the audio system, and wherein the actions further comprise:

identifying a current number of people from a set of sensor data included in the inputs; and comparing the identified current number of people with the predefined number of people, wherein the comparing corresponds to a selected one of the dynamic rules, and wherein the retrieved audio adjustment is retrieved from the selected dynamic rule.

13. The information handling system of claim 9 wherein a selected one of the dynamic rules is a predefined person being proximate to the audio system, and wherein the actions further comprise:

identifying one or more people currently proximate to the audio system, wherein the identifying is based on one or more sets of received sensor data;

comparing a predefined set of sensor data that corresponds to the predefined person with the one or more sets of received sensor data; and in response to determining, based on the comparison, that the predefined person is currently proximate to the audio system, applying an adjustment associated with the selected dynamic rule to the audio system.

14. The information handling system of claim 9 wherein the actions further comprise:

applying analytic analysis to the inputs to identify quantities related to the set of rules; and utilizing the identified quantities to select the adjustment to the output of the audio system corresponding to one of the rules.

15. The information handling system of claim 9 wherein at least one of the inputs is selected from a group consisting of audio from a microphone, a digital image from a digital camera, a presence data received from a presence sensor, a date/time from a digital clock, a number of people, a particular person, and an approximate age of a person.

16. The information handling system of claim 9 wherein the plurality of dynamic rules are prioritized at a higher priority level than the plurality of static rules.

17. A non-transitory computer readable storage medium comprising a set of computer instructions, the computer instructions effective to cause an information handling system to perform actions comprising:

prioritizing a plurality of dynamic rules and a plurality of static rules, wherein the dynamic rules and the static rules are included in a set of rules applied to an output of an audio system;

comparing a set of one or more inputs to the set of rules, wherein the comparing is performed according to the prioritization of the dynamic rules and the static rules;

retrieving at least one audio adjustment based on the comparisons; and automatically adjusting the output of the audio system based on the retrieved audio adjustment.

18. The non-transitory computer readable storage medium of claim 17, wherein the audio adjustment is an automatic dynamic range control that sets a maximum volume of the audio system.

19. The non-transitory computer readable storage medium of claim 17, wherein the audio adjustment is an automatic volume control that adjusts a volume of the audio system.

20. The non-transitory computer readable storage medium of claim 17 wherein one of the dynamic rules is a predefined number of people proximate to the audio system, and wherein the actions further comprise:
   identifying a current number of people from a set of sensor data included in the inputs; and
   comparing the identified current number of people with the predefined number of people, wherein the comparing corresponds to a selected one of the dynamic rules, and wherein the retrieved audio adjustment is retrieved from the selected dynamic rule.

21. The non-transitory computer readable storage medium of claim 17 wherein a selected one of the dynamic rules is a predefined person being proximate to the audio system, and wherein the actions further comprise:
   identifying one or more people currently proximate to the audio system, wherein the identifying is based on one or more sets of received sensor data;
   comparing a predefined set of sensor data that corresponds to the predefined person with the one or more sets of received sensor data; and
   in response to determining, based on the comparison, that the predefined person is currently proximate to the audio system, applying an adjustment associated with the selected dynamic rule to the audio system.

22. The non-transitory computer readable storage medium of claim 17 wherein the actions further comprise:
   applying analytic analysis to the inputs to identify quantities related to the set of rules; and
   utilizing the identified quantities to select the adjustment to the output of the audio system corresponding to one of the rules.

23. The non-transitory computer readable storage medium of claim 17 wherein the plurality of dynamic rules are prioritized at a higher priority level than the plurality of static rules.

* * * * *